(12) United States Patent  
Raghu et al.

(10) Patent No.: US 8,902,658 B1  
(45) Date of Patent: *Dec. 2, 2014

(54) THREE-DIMENSIONAL NAND MEMORY WITH ADAPTIVE ERASE

(71) Applicant: SanDisk Technologies Inc., Plano, TX (US)

(72) Inventors: Deepak Raghu, Milpitas, CA (US); Gautam Dusija, Milpitas, CA (US); Chris Avila, Saratoga, CA (US); Yingda Dong, San Jose, CA (US); Man Mui, Fremont, CA (US); Pao-Ling Koh, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/283,919

(22) Filed: May 21, 2014

Related U.S. Application Data

(63) Continuation of application No. 14/044,143, filed on Oct. 2, 2013.

(51) Int. Cl.
  *G11C 16/04* (2006.01)
  *G11C 16/16* (2006.01)

(52) U.S. Cl.
  CPC ............ *G11C 16/16* (2013.01); *G11C 16/0483* (2013.01)
  USPC ............ 365/185.13; 365/185.25; 365/185.26; 365/185.29

(58) Field of Classification Search
  USPC .............. 365/185.13, 185.29, 185.25, 185.26
  See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 7,852,683 B2 * | 12/2010 | Lutze et al. .............. 365/185.24 |
| 8,014,209 B2 * | 9/2011 | Lutze et al. .............. 365/185.29 |
| 8,077,524 B2 * | 12/2011 | Lutze et al. .............. 365/185.24 |
| 8,441,059 B2 * | 5/2013 | Sim et al. ...................... 257/324 |
| 2013/0163336 A1 | 6/2013 | Li et al. |

OTHER PUBLICATIONS

U.S. Appl. No. 14/044,143, filed Oct. 2013, Reghu et al.*

(Continued)

*Primary Examiner* — Pho M Luu
(74) *Attorney, Agent, or Firm* — Davis Wright Tremaine LLP

(57) ABSTRACT

Erasing memory cells in certain 3-D NAND charge-storage memory arrays is achieved by rapidly charging vertical conductors using Gate Induced Drain Leakage (GIDL) current generated in select transistors. When bit line voltage drops below its nominal value, select line voltage is controlled to maintain a constant voltage difference between bit line voltage and select line voltage thus maintaining a gate-drain voltage difference in select transistors that provides sufficient GIDL current for erase.

17 Claims, 15 Drawing Sheets

(56) References Cited

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Choi et al., "Investigation of Gate-Induced Drain Leakage (GIDL) Current in Thin Body Devices: Single-Gate Ultra-Thin body, Symmetrical Double-Gate, and Asymmetrical Double-Gate MOSFETs," The Japan Society of Applied Physics, vol. 42, (2003), pp. 2073-2076.

* cited by examiner

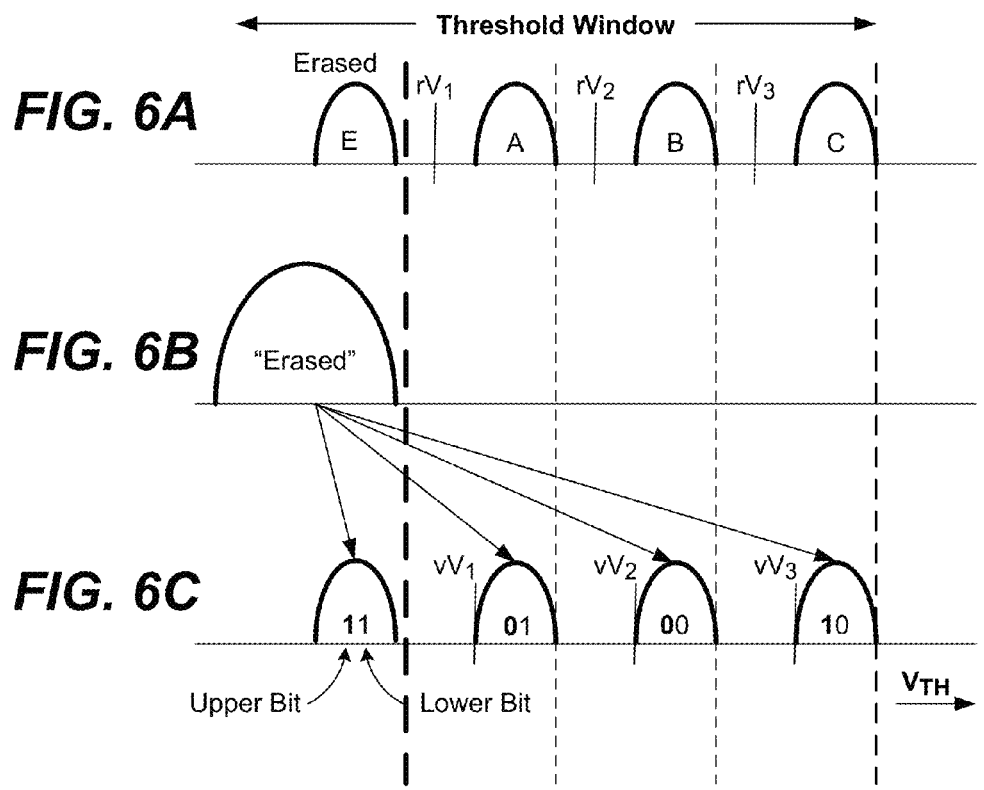
Programming into four states represented by a 2-bit code

THREE-DIMENSIONAL NAND MEMORY WITH ADAPTIVE ERASE

CROSS-RELATED APPLICATION

This application is a continuation of U.S. application Ser. No. 14/044,143 filed Oct. 2, 2013, which application is incorporated herein in its entirety by this reference.

BACKGROUND

This application relates to the operation of re-programmable nonvolatile three dimensional memory systems such as semiconductor flash memory which record data using charge stored in charge storage elements of memory cells and to efficient erase of such data.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In certain 3-D NAND charge-storage memory arrays, vertical conductors that connect memory cells in series are charged-up for erase operations using Gate Induced Drain Leakage (GIDL) current generated in select transistors at either end of NAND strings. When bit line voltage drops below its nominal value there may be insufficient gate-drain voltage difference in select transistors to provide the GIDL current needed. When such a drop is indicated, erase conditions may be changed so that select line voltage (voltage applied to the gates of select transistors) is controlled to maintain a constant voltage difference between bit line voltage (or source line voltage) and select line voltage. Thus the gate-drain voltage difference in select transistors is maintained at a level that provides sufficient GIDL current for erase.

An example of a method of operating a three dimensional nonvolatile memory array includes: performing a first plurality of erase operations on a block during a first period of operation of the three dimensional nonvolatile memory using a first set of erase conditions, the first set of erase conditions assigning a predetermined first voltage to a line supplying a gate of a select transistor; subsequently determining that an erase operation using the first set of erase conditions does not fully erase at least some memory cells of the block; subsequently replacing the first set of erase conditions with a second set of erase conditions for the block, the second set of erase conditions assigning a second voltage to the line supplying the gate of the select transistor, the second voltage having a fixed offset from a drain voltage that is observed on a line connected to the drain of the select transistor; and subsequently performing a second plurality of erase operations on the block during a second period of operation of the three dimensional nonvolatile memory using the second set of erase conditions.

The predetermined first voltage may be assigned to gates of all select transistors of the block for erase operations during the first period and the second voltage may be assigned to gates of all select transistors of the block for erase operations during the second period. The method may include determining that erase operations using the first set of erase conditions do not fully erase at least some memory cells of other blocks that share bit lines with the block. The line connected to the drain of the select transistor may be a bit line and the first set of erase conditions may assign an erase voltage to the bit line. Voltage on the bit line may be observed and a determination may be made that a difference between the assigned erase voltage and the observed bit line voltage exceeds a threshold amount. The first set of erase conditions may be replaced with the second set of erase conditions for the other blocks that share bit lines with the block. The fixed offset of the second voltage from the drain voltage may be sufficient to induce Gate Induced Drain Leakage (GIDL) in the select transistor. The line connected to the drain of the select transistor may be a source line that is assigned an erase voltage according to the first and second sets of erase conditions, the drain voltage that is observed on the source line differing from the predetermined erase voltage by at least a threshold amount. The first set of erase conditions may assign an erase voltage of between 22 volts and 26 volts to the line supplying the drain of the select transistor, and may assign a voltage of between 15 volts and 19 volts to the line supplying the gate of the select transistor, and the second set of erase conditions may assign an erase voltage of between 22 volts and 26 volts to the line supplying the drain of the select transistor and may assign a voltage to the line supplying the gate of the select transistor that is less than a measured voltage on the line supplying the drain of the select transistor by a fixed offset amount of between 6 volts and 10 volts. The first set of erase conditions may assign an erase voltage of between 22 volts and 26 volts to bit lines and source lines, and may assign a voltage of between 15 volts and 19 volts to select lines supplying gates of select transistors, and the second set of erase conditions may assign an erase voltage of between 22 volts and 26 volts to bit lines and source lines, and may assign a voltage to the select lines that is less than a measured voltage on a bit line or a source line by a fixed offset amount of between 6 volts and 10 volts.

An example of a method of operating a three dimensional nonvolatile memory array includes: operating a plane of the three dimensional nonvolatile memory array according to a default erase scheme for all erase operations during a first period of operation of the nonvolatile memory array; subsequently determining that two or more blocks of the plane are not adequately erased using the default erase scheme; in response to the determining, measuring bit line voltage during an erase operation using the default erase scheme to identify a difference between measured bit line voltage and a target bit line voltage; in response to identifying a difference that exceeds a threshold amount, replacing the default set of erase parameters with a modified set of erase parameters, the modified set of erase parameters including at least one select voltage that is not fixed, the at least one select voltage being modulated according to a measured bit line voltage; and subsequently operating the plane of the three dimensional nonvolatile memory array using the modified set of erase parameters throughout a second period of operation of the nonvolatile memory array.

The first period of operation may extend from initialization of the three dimensional nonvolatile memory array until a threshold number of blocks of the plane are identified as bad blocks that are not usable for storage of data because of erase failure. The blocks identified as bad blocks because of erase failure may be tested to determine if they suffer from erase failure when erased using the modified set of erase conditions. For any block identified as a bad block because of erase failure that does not suffer from erase failure when erased using the modified set of erase conditions, the block may cease to be identified as a bad block as a bad block when beginning the second period of operation of the nonvolatile memory array.

An example of a three dimensional nonvolatile memory system includes: a three dimensional nonvolatile memory array including a plurality of memory blocks that share bit lines; and an adaptive erase circuit that supplies voltages to conductive lines of the plurality of memory blocks during an erase operation, the adaptive erase circuit having at least two operating modes, including: (i) a fixed mode in which a first voltage applied to a first conductive line has a predetermined target, and (ii) an adaptive mode in which the first voltage applied to the first conductive line is modulated according to a second voltage that is found on a second conductive line.

The first conductive line may be a select line and the second conductive line may be a bit line. The first conductive line may be a select line and the second conductive line may be a source line. A testing circuit may test a difference between a voltage on the second conductive line and a target voltage in the fixed mode to determine if the difference exceeds a threshold. The first conductive line may be connected to a gate of a select transistor, the second conductive line may be connected to a drain of the select transistor and, in the adaptive mode, the first voltage may be modulated according to the second voltage to maintain a gate-drain voltage difference that provides sufficient Gate Induced Drain Leakage (GIDL) hole current to charge a memory hole for erase of memory cells. The gate-drain voltage difference may be maintained at about −7 volts.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

DETAILED DESCRIPTION

Memory System

Figure 1:
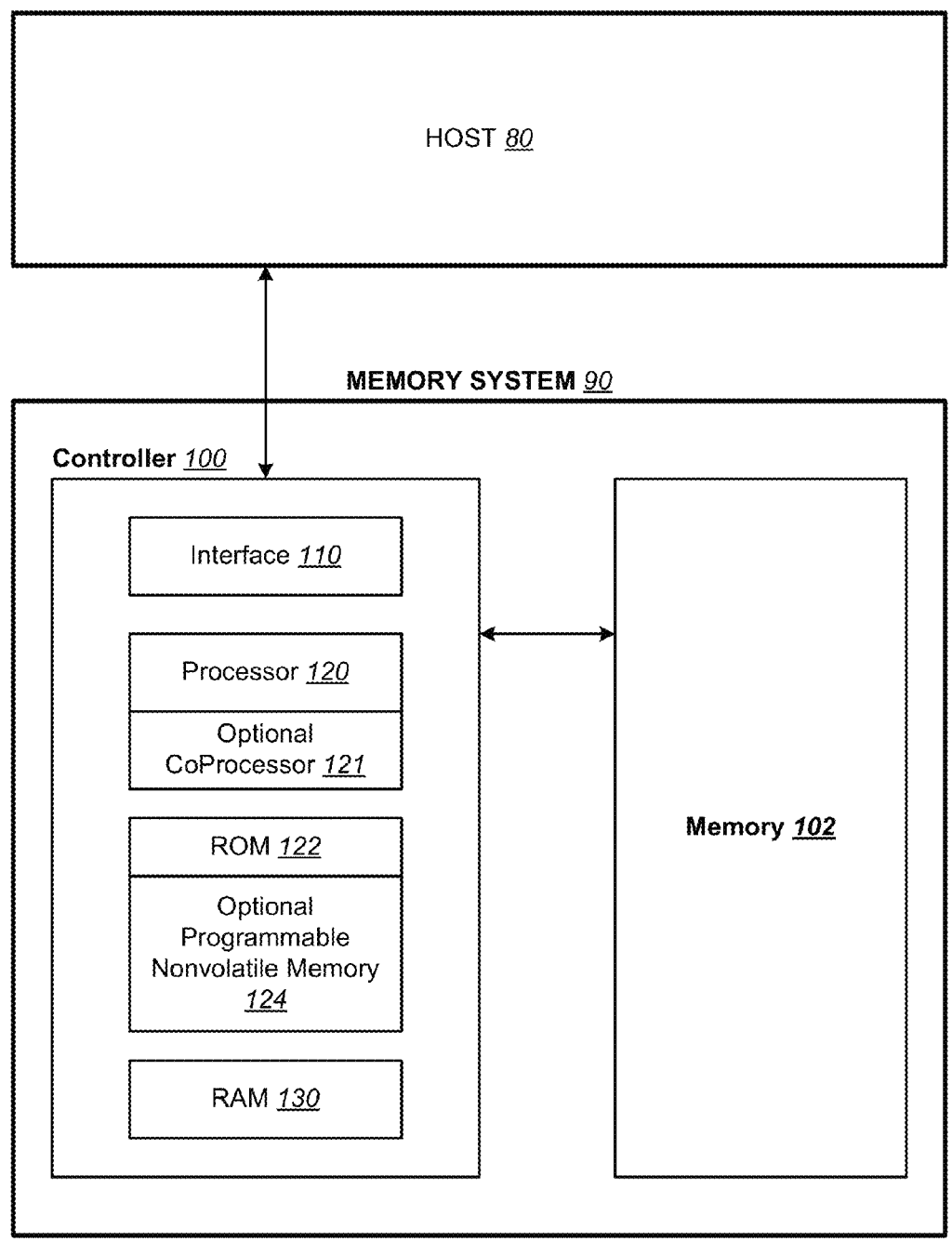
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
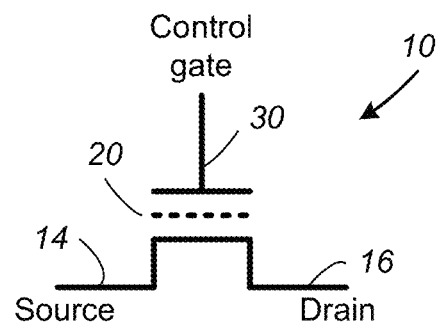
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
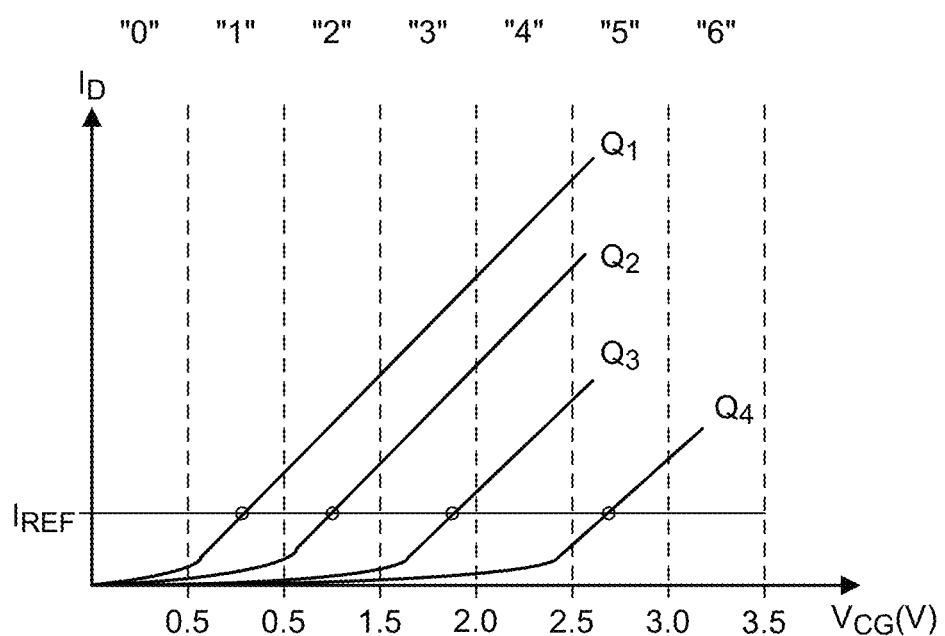
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
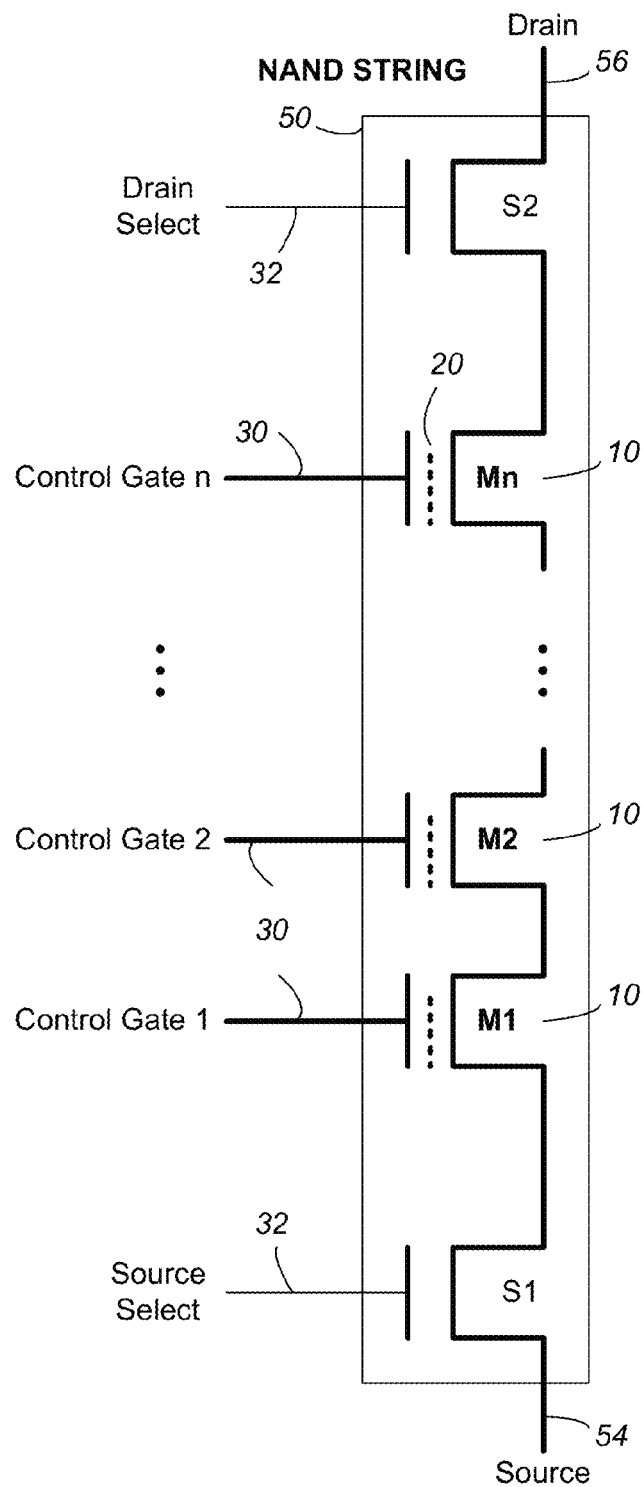
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
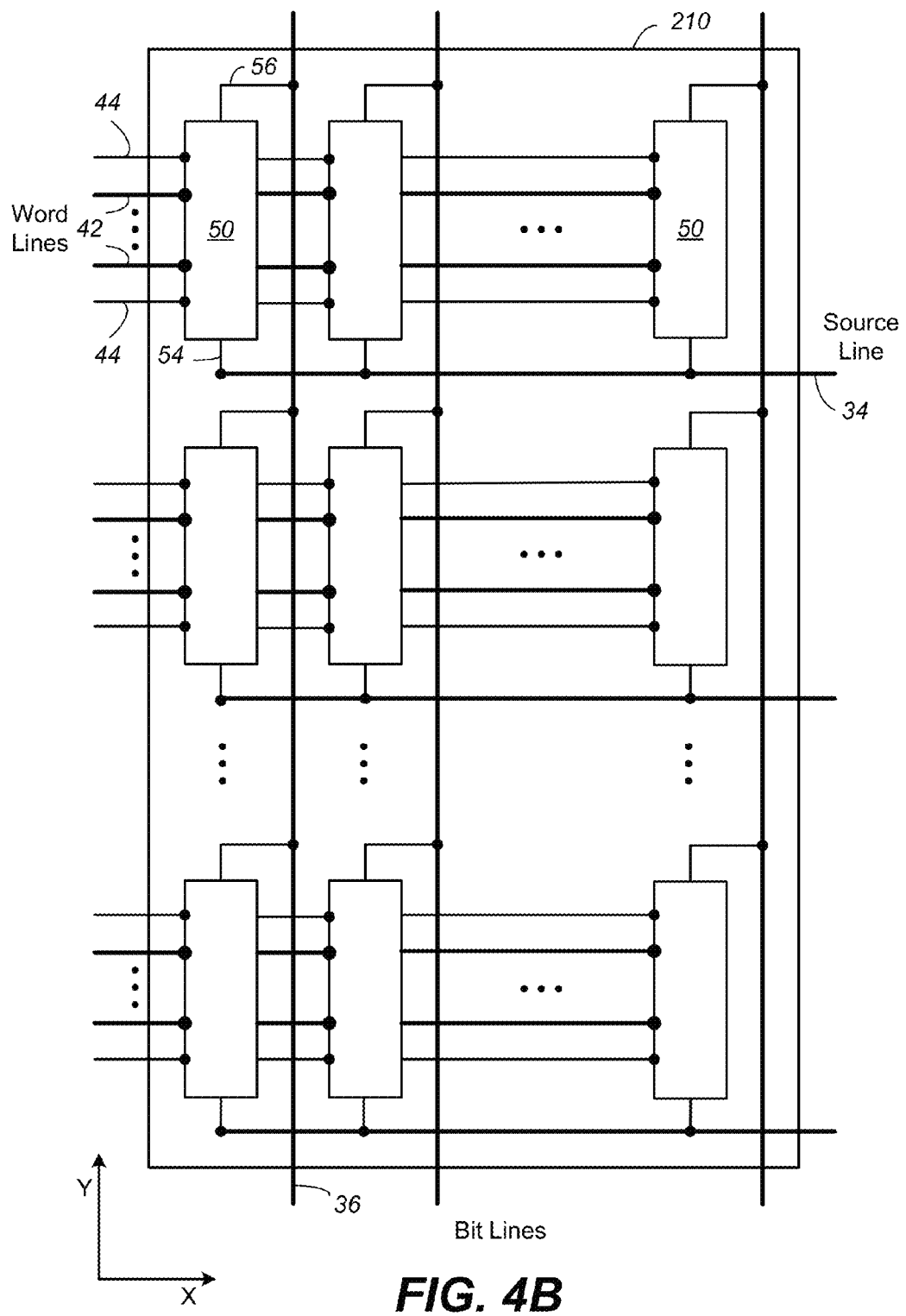
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
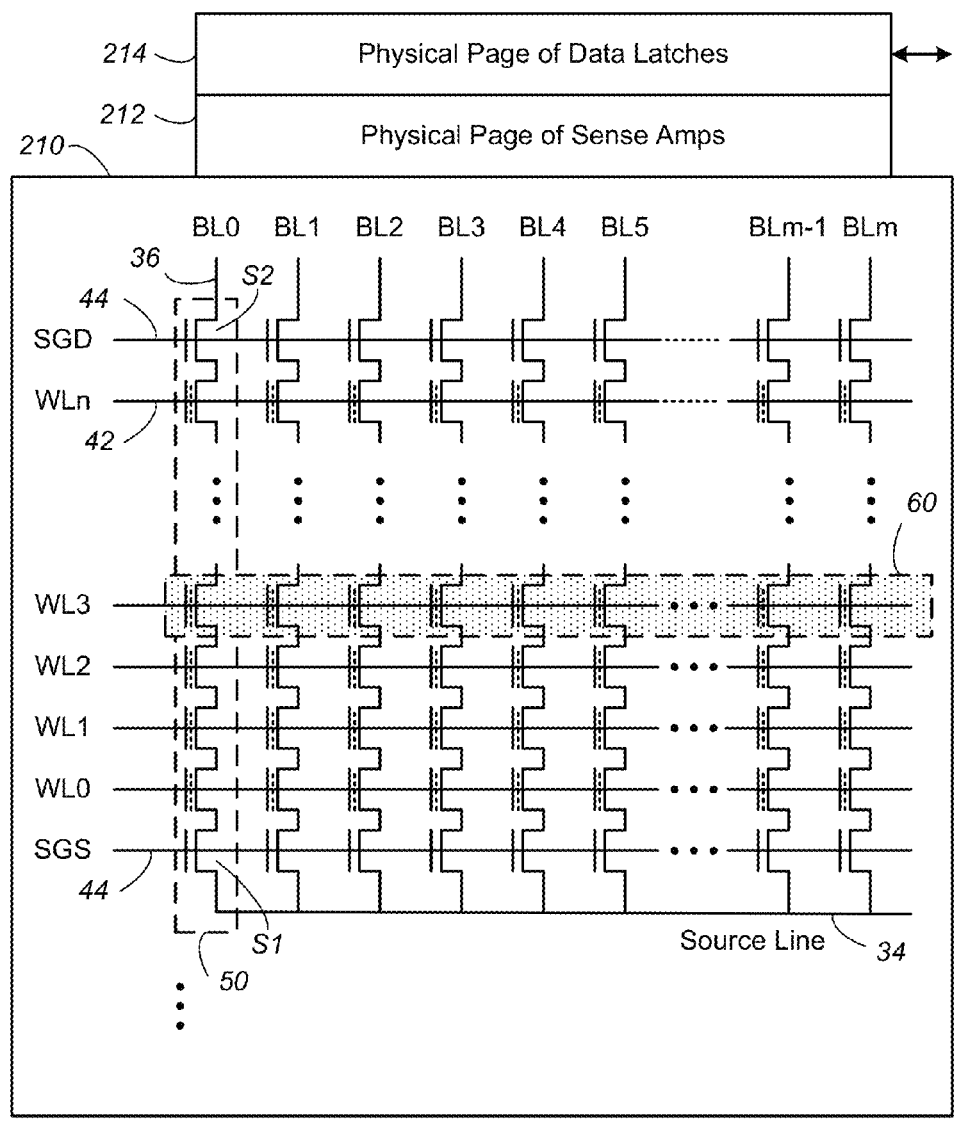
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

all-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
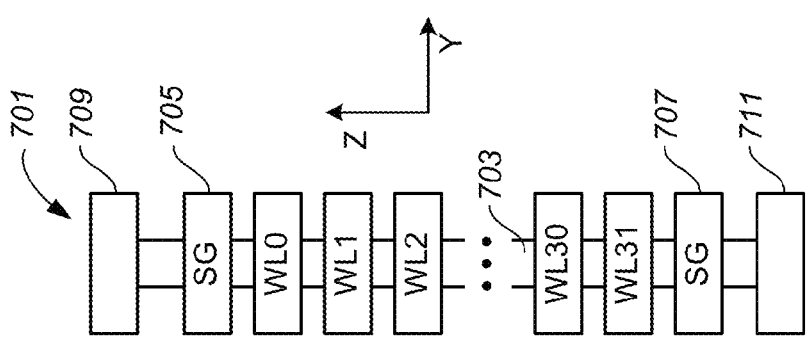
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
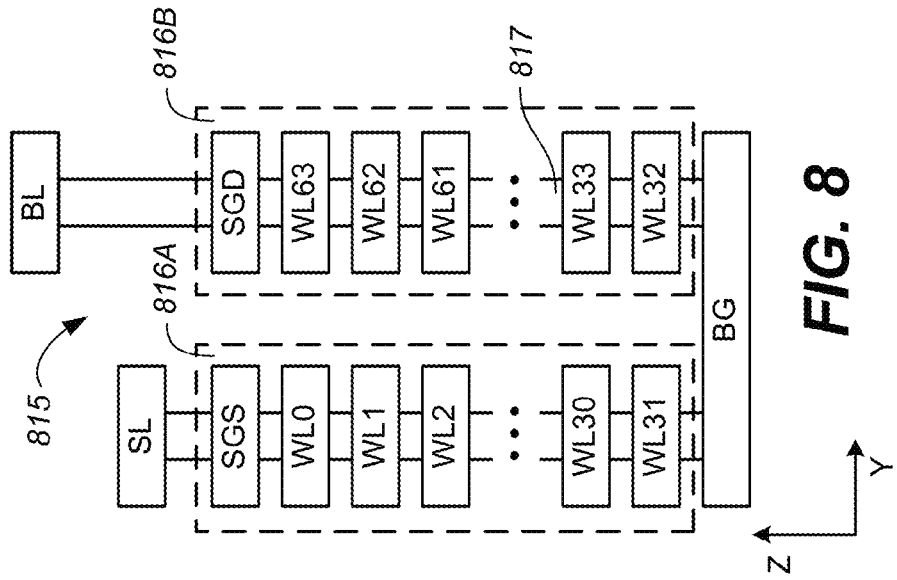
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
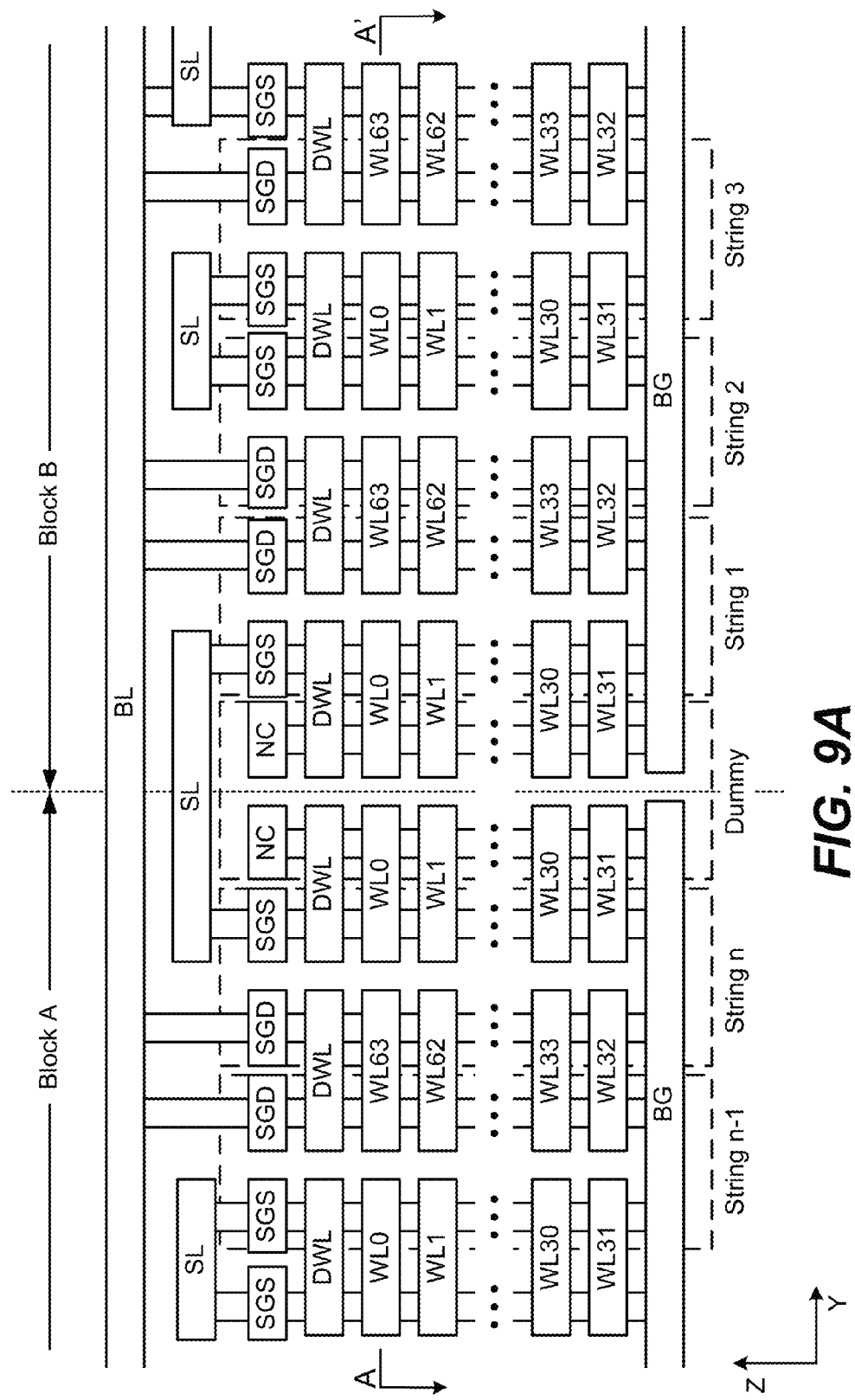
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example. Control circuits are connected to the back gates of each block so that appropriate bias may be applied to back gates. The structure of back gates is further explained below.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 9B:
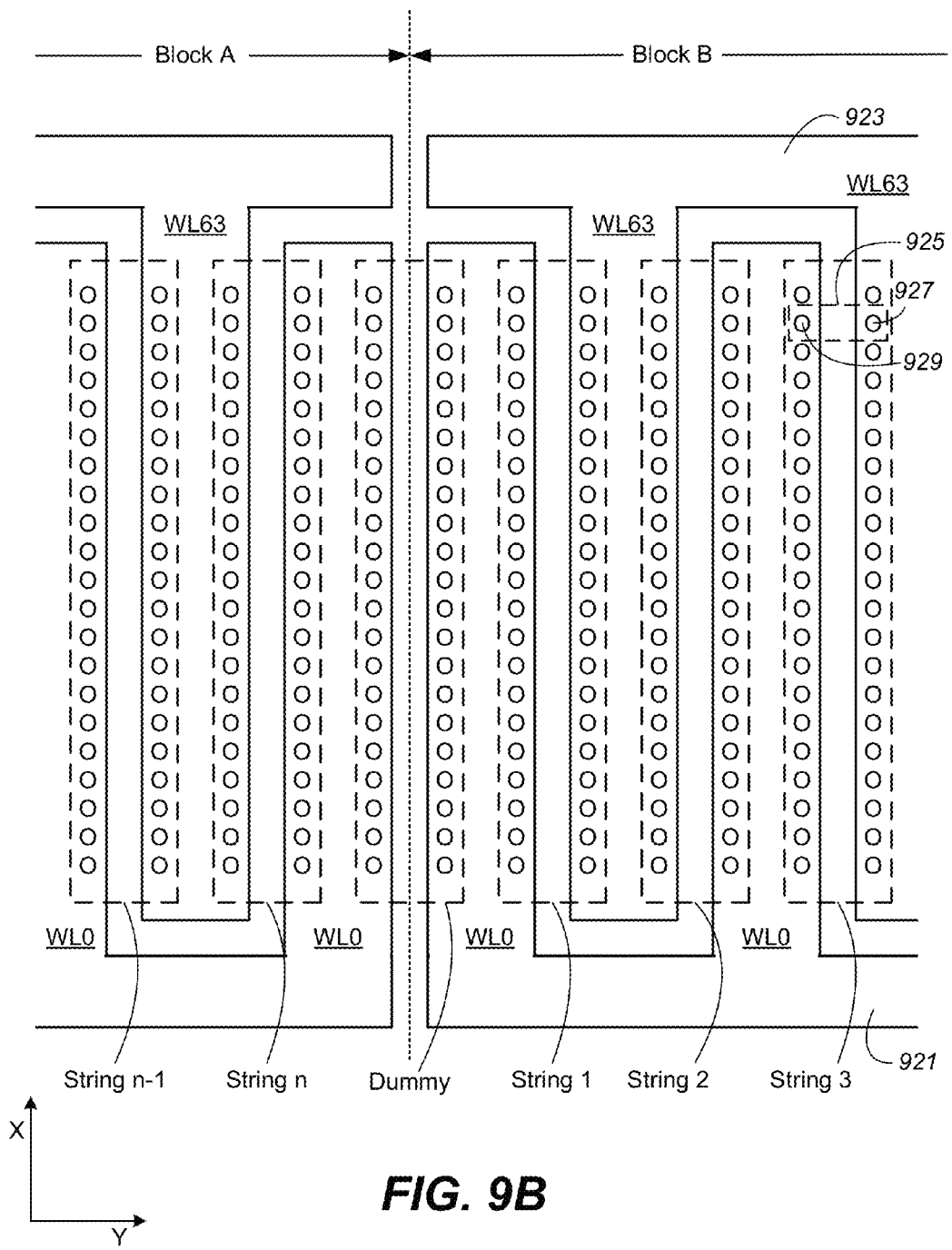
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STT) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the y-direction). For example, one such set is made up of all strings indicated by "String 3" in Block B, including string 925. When a given set of strings within a block is selected, a selected word line (or portion of a word line, i.e. a subset of the bit lines that intersect the word line) may be read by applying appropriate word line voltages to the selected word line and to unselected word lines. A Back Gate (not shown in FIG. 9B) extends under the word lines of Block B to control all BG transistors of all strings in the block. When an appropriate bias is applied to the BG of Block B, the back gate transistor of string 925 and back gate transistors of all other similar strings indicated by "String 3" turn on to enable accessing of memory cells of String 3

Figure 10A:
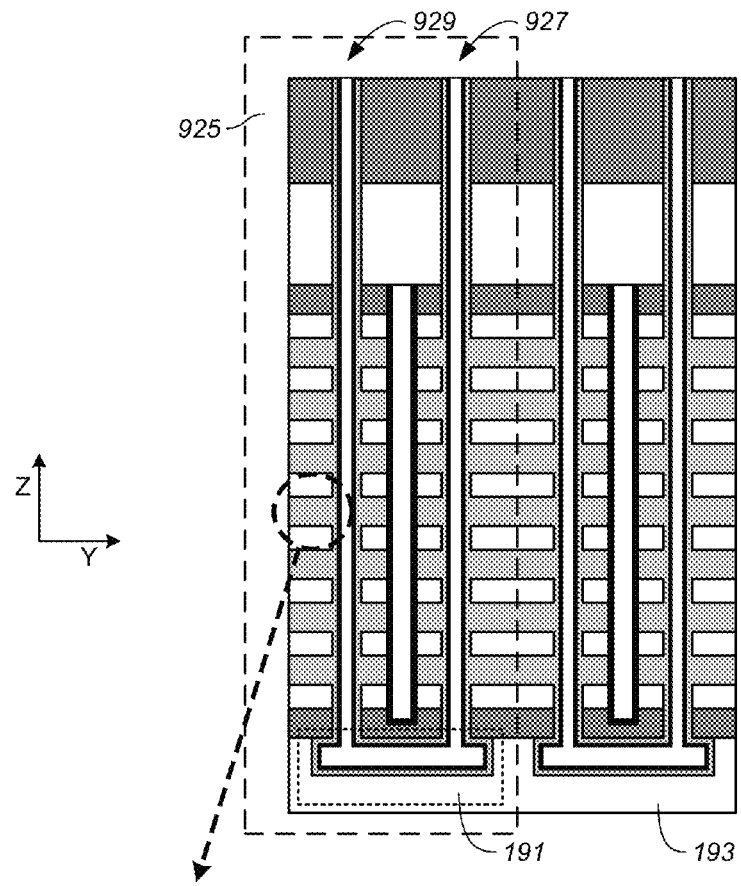
FIGS. 10A-10B shows examples of structures of NAND strings.

FIG. 10A shows a cross section along a y-z plane that intersects memory holes 927, and 929 of NAND string 925 so that the structures formed within memory holes (memory hole structures) may be clearly seen. FIG. 10A shows that memory holes 927 and 929 are connected together at the bottom by back gate 191 so that the two wings may be electrically connected in series.

Figure 10B:
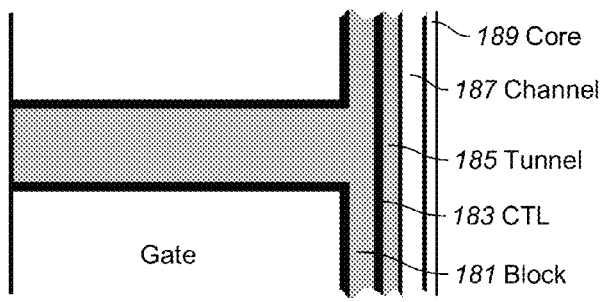

FIG. 10B shows the structure of a stack of layers in the memory hole 929 where memory cells are formed. It can be seen that a blocking dielectric "Block" 181 is deposited on the walls of the memory hole to provide electrical isolation. A Charge Trapping Layer (CTL) 183 is deposited on the blocking dielectric 181. The CTL layer 183 forms charge storage elements where the CTL is in close proximity to polysilicon word lines. A tunnel dielectric 185 is deposited to provide electrical isolation and to allow charge to tunnel into the CTL layer 183 under certain conditions. A channel layer 187 is deposited to form the channel of the memory cells along the string. A core material 189 is deposited that forms the core of the column that is located in the memory hole.

When a NAND string is made using a memory hole, layers are deposited within the cylindrical memory hole so that the memory hole is filled in a substantially uniform manner with all deposited layers being present in at all levels (though some variation in memory hole diameter and other dimensions may occur). In contrast to planar NAND, where films deposited on a substrate surface can be patterned by photolithography, films deposited within a memory hole are generally not exposed in a manner that allows such patterning. As a result, charge storage elements formed by a charge trapping layer may be present in select transistors. To deal with this, select transistors may be managed in a way that maintains their characteristics within desirable ranges. Examples of such management are described in U.S. patent application Ser. No. 13/801,800, filed on Mar. 13, 2013.

Figure 11:
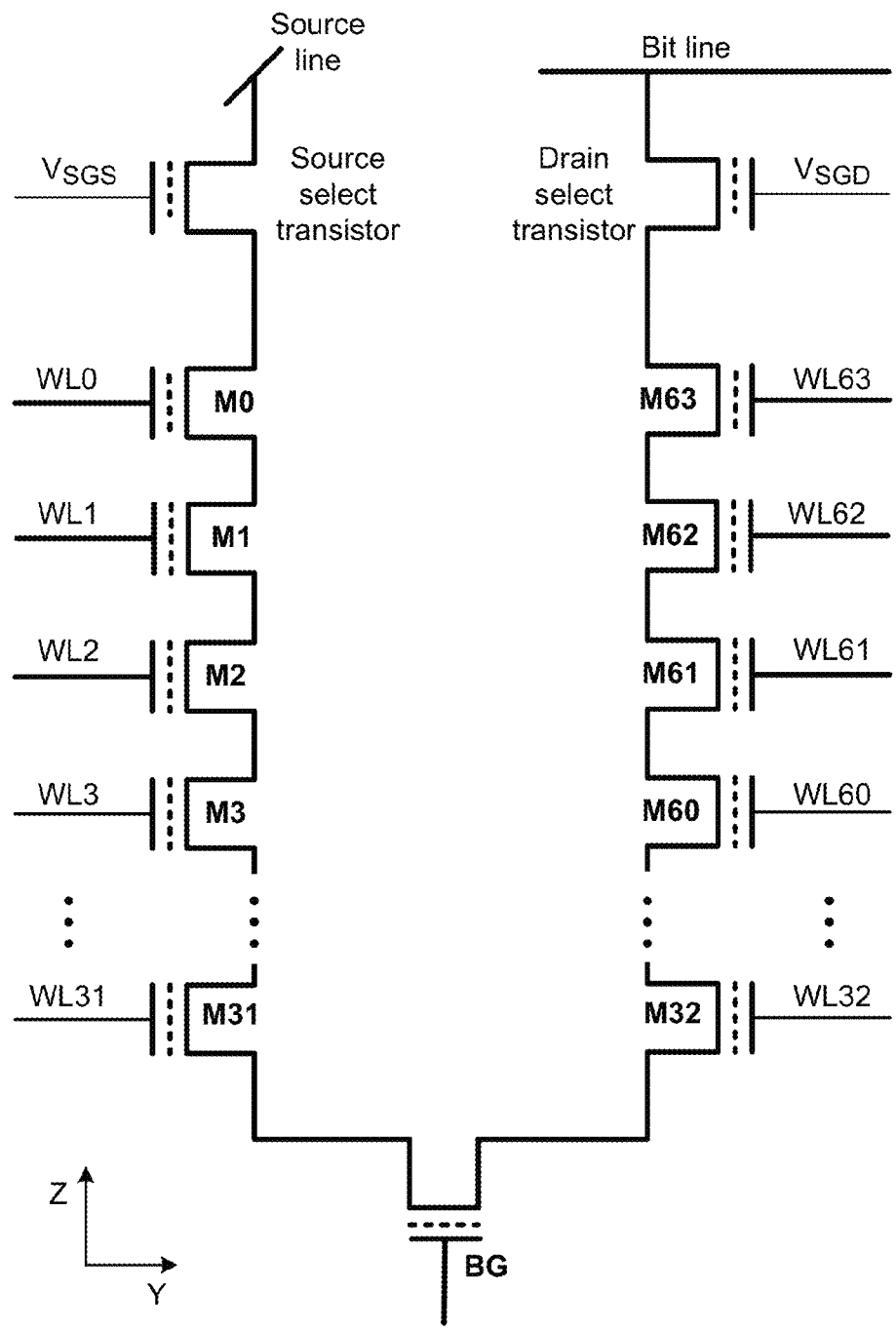
FIG. 11 is a schematic of a NAND string with two wings connected by a back gate.

FIG. 11 shows a schematic of a U-shaped NAND string including memory cells M0-M63, a source select transistor, a drain select transistor, and a back gate transistor BG connected in series. The source of the NAND string is connected to a source line and the drain of the NAND string is connected to a bit line. In order to access the cells of the NAND string, appropriate voltages are applied to various lines associated with the NAND string, including the source select line, drain select line, source line, and bit line. For example, during erase a relatively high positive voltage, erase voltage (Verase) may be applied to the source line and bit line and appropriate voltages may be applied to both source select lines in order to provide current to positively charge the memory holes.

Gate Induced Drain Leakage (GIDL)

One mechanism that is used in some 3-D memories to provide rapid charging for erase of charge storage memory cells is Gate Induced Drain Leakage (GIDL). Appropriate voltages may be applied so that a GIDL current is generated in both select transistors to rapidly charge memory hole structures (i.e. to supply charge to the core that is formed in the memory holes). This may mean having a gate-to-drain voltage difference of at least −7 volts in select transistors in order to have a sufficient GIDL current to rapidly charge memory hole structures. Thus the select line voltage applied to the gates of select transistors is less than the erase voltage applied to the bit lines and source lines by at least 7 volts in order to produce sufficient GIDL. A suitable select line voltage may be selected so that GIDL is sufficient. For example, where the erase voltage applied to source lines and bit lines is 24 volts, a select line voltage may be less than 17 volts (e.g. 16 volts) to ensure adequate GIDL current.

Figure 12:
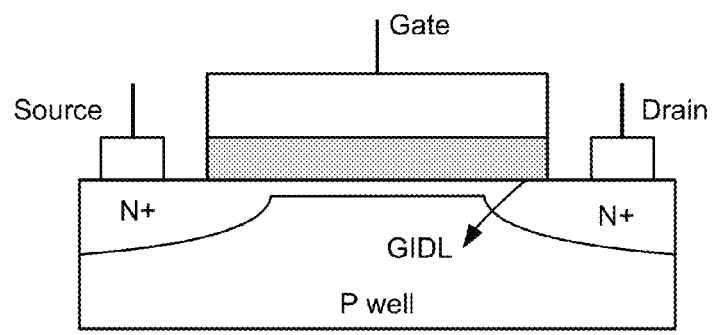
FIG. 12 shows an example of GIDL in a planar transistor.

FIG. 12 shows an example of a GIDL current in a planar device. The GIDL current depends on the geometry of the transistor and on the voltages applied. In many devices, GIDL is seen as an undesirable effect and designers may attempt to avoid significant GIDL by choosing appropriate dimensions and doping levels.

Figure 13:
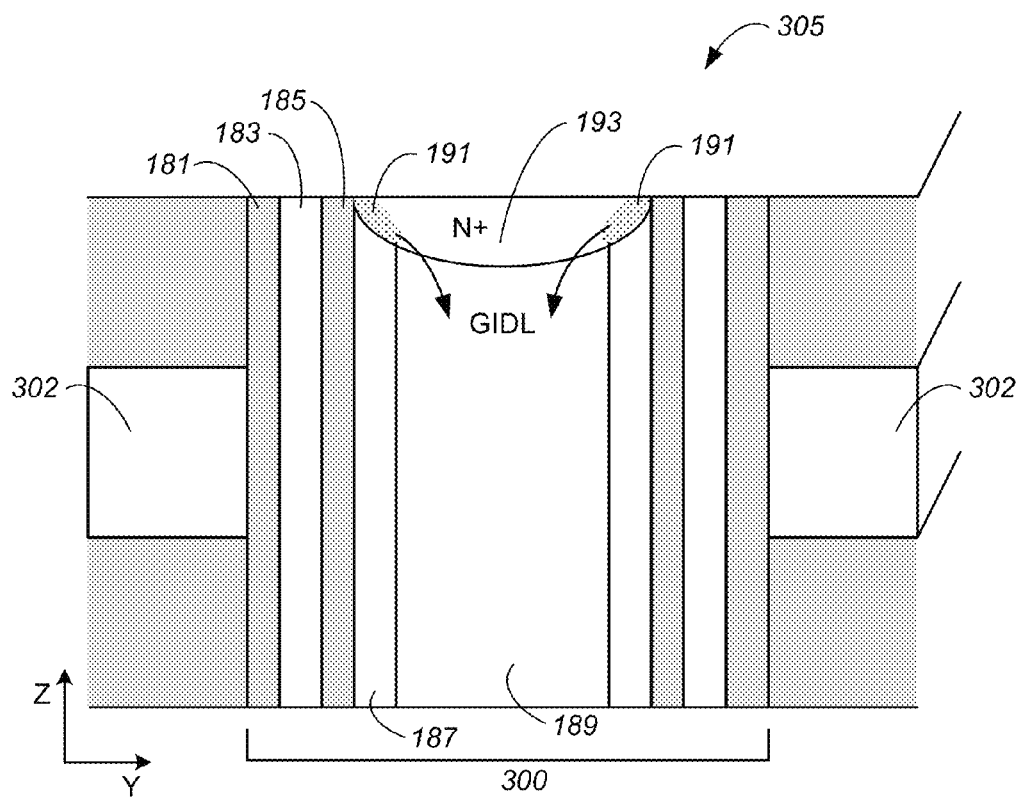
FIG. 13 shows an example of GIDL in a select transistor of a 3-D memory array.

FIG. 13 shows a GIDL current in a select transistor 305 of a 3-D NAND memory array. The cross-section shown extends through the middle of a memory hole structure 300 and shows the core 189, channel 187, an N+ contact region 193 (e.g implanted region), an N+ boundary 191 between contact region 193 and channel 187, tunnel 185, CTL 183, and block 181 layers in cross-section. The select line 302 can be seen on either side of the memory hole structure 300. It will be understood that the memory hole structure 300 is cylindrical in shape with its axis extending in the z-direction, through the select line 302, which extends in the x-direction. The gate of the select transistor is formed where the select line 302 wraps around memory hole structure 300. The drain of the select transistor includes the portion of the channel layer 187 that extends above the level of the select line 302. An electrical connection to the drain of the select transistor is formed where a bit line (a horizontal bit line, or global bit line) or a source line connects to the channel layer 187 as shown by N+ contact region 193, which connects to channel region 187 through N+ boundary 191. The GIDL current produced at boundary 191 is used to charge up channel 187. Holes (positive charge) tunnel through tunnel layer 185 to CTL layer 183 where they recombine with trapped electrons (negative charge) thus reducing stored charge and threshold voltages of memory cells. In order to produce a significant GIDL current as shown, appropriate voltages must be applied to the terminals of a select transistor. In particular, there must be an adequate voltage difference between the drain (source, or bit line voltage) and the gate (select line voltage). This may be achieved by using drivers for source lines, bit lines, and select lines that attempt to drive the respective lines to target voltages that are specified by a set of erase conditions. It will be understood that the example of FIG. 13 is for illustration and that GIDL current may be produced in various structures with different geometries, materials, dopants, doping profiles, etc.

In some memory systems, after some significant use, bit line voltage may drop from its target voltage (e.g. due to leakage). In some cases, a physical defect may cause bit line voltage to drop even prior to significant use. Thus, a bit line with a target voltage of 24 volts may not be driven to 24 volts, but may instead only reach some lower voltage. In planar NAND such drops may not be significant and other voltages may be adjusted to compensate. In a 3-D NAND which uses GIDL for erase, such drops may have an impact on GIDL current and thus have an impact on erase operations. Erase operations may become slower and may fail if a timeout period is exceeded.

According to an aspect of the present invention, erase operations may use a default set of erase conditions initially to perform erase operations. For example, such a set of erase conditions may include target voltages for erase voltage (applied to bit lines and source lines) and for select line voltages (applied to source select lines and drain select lines). Erase circuits may separately drive these components to their target voltages. This provides a simple, efficient way to generate sufficient GIDL current for erase. At a later time, when memory characteristics indicate that the default set of conditions are not achieving desired performance (e.g. due to wear caused by a large number of write-erase cycles, or defects, or some other reason), the default set of erase conditions may no longer be effective and may be replaced by a modified set of erase conditions. For example, such a modified set of erase conditions may include a target for erase voltage supplied to bit lines and source lines as before. However, instead of using a target select line voltage, the select line voltage may simply be an offset from observed bit line voltage. Thus, as the observed bit line voltage drops below its target, the select line voltage drops accordingly and thus adapts to changes in bit line voltages as the memory becomes worn.

Figure 14:
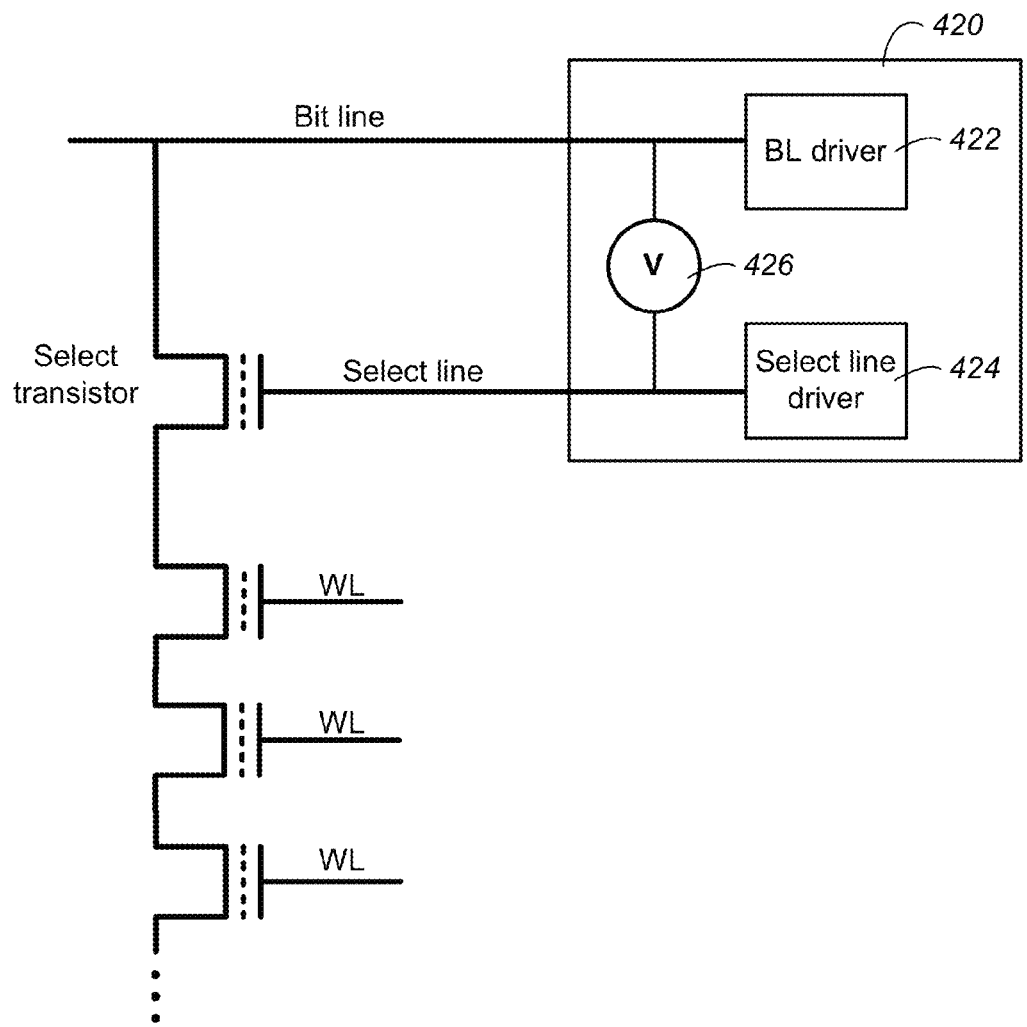
FIG. 14 shows an example of an adaptive erase circuit.

FIG. 14 shows an example of a circuit that may be used for adaptive erase. In particular, FIG. 14 shows adaptive erase circuit 420 that includes a bit line driver 422 that drives a voltage on the bit line and a select line driver 424 that drives a voltage on a select line. In a first mode, the bit line driver 422 and the select line driver 424 operate independently to drive their respective lines to respective target voltages. However, in a second mode, the bit line driver 422 may continue to attempt to drive the bit line voltage to a target voltage while the select line driver 424 attempts to maintain the select line at a fixed voltage offset from the bit line voltage. In this mode, the select line driver 424 uses an input from measurement of bit line voltage instead of using a fixed target voltage. It will be understood that maintaining a voltage offset may be achieved in a variety of different ways (e.g. select line voltage could be fixed and bit line voltage could be based on select line voltage). The bit line voltage may be measured, or the difference between the bit line voltage and select line voltage may be measured (as shown) using an appropriate voltage measurement circuit 426. The select line driver 424 adjusts its output according to the voltage difference that is measured between the bit line and the select line in order to maintain the voltage difference between the two at a target voltage difference (or close to the target voltage difference). For example, where a gate-drain voltage of −7 volts provides sufficient GIDL current to charge up a memory hole structure, the target for gate-drain voltage may be −8 volts and the select line driver will adjust its output to achieve this target difference.

While FIG. 14 shows control of a single select transistor, it will be understood that an erase operation is performed over an entire block and that other select transistors of the block (both source select transistors and drain select transistors) may be similarly biased so that each memory hole structure in the block receives a sufficient GIDL current to charge up the memory hole.

An erase operation may have multiple phases including a charging phase and an active erase phase. It will be understood that GIDL current may be used to rapidly charge up a memory hole structure during a charging phase and may not necessarily be needed during other phases so that the offset select line voltage may not be maintained throughout the erase operation, but only during one or more phases. It will also be understood that an acceptable range of GIDL current for a particular erase operation depends on the physical structure of the memory (e.g. how large the memory holes are and thus how much charge is needed) and the constraints of any standards applied to erase operations (e.g. what is the maximum time allowed for an erase operation).

Plane-Wide Failures

In some cases, erase failures are caused by a drop in bit line voltage (or source line voltage) so that the actual voltage is less than the target voltage. Thus, the actual gate-drain voltage is less than intended, and may be less than needed to provide sufficient GIDL current for an erase operation. Bit lines generally extend to serve multiple blocks of a plane. A plane may be thought of as a group of blocks that are connected by the same set of bit lines. Thus, a drop in bit line voltages generally affects blocks throughout a given plane, not just a single block.

In some cases, a drop in bit line voltages may be detected by a pattern of erase failures throughout a plane. While other failure modes may affect a single block, a drop in bit line voltage will generally affect all blocks of a plane. Thus, while a single block erase failure may be addressed by marking the block as a bad block, or using some other single block approach, when multiple blocks of a plane show a pattern of erase failures this may be an indication of dropping bit line voltage. Thus, such a pattern may be a trigger for some testing to determine if bit line voltage is dropping and/or if some change in erase conditions is needed.

In some cases a plane-wide pattern of erase characteristics may be identified before an actual erase failure occurs. For example, while an erase failure may mean failure to erase within a given time limit or erase loop count limit, a drop in bit line voltages may be indicated by increasing time or increasing erase loop count prior to reaching any such limit. Erase operations may be monitored to see if there is a plane-wide pattern of increasing time or erase loop count. If such a pattern is found then a change in mode may be implemented before failure occurs (either with or without further testing). In this way, a change in mode may be implemented in a proactive manner.

Because dropping bit line voltages affect all blocks of a plane, it is generally desirable to implement a solution on a plane-wide basis. Thus, rather than performing reconfiguration from one set of erase conditions to another on a block-by-block basis, it may be better to reconfigure the entire affected plane for erase with a select voltage offset from bit line voltage. In some cases, it may be preferable to reconfigure all planes of a memory chip together so that a single set of erase conditions may be used for all erase operations in the memory chip (rather than operating different planes with different schemes).

Figure 15:
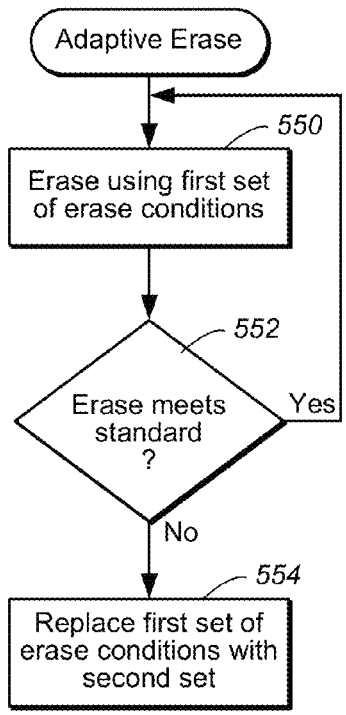
FIG. 15 illustrates an adaptive erase scheme.

FIG. 15 shows an example of an adaptive erase approach that may be implemented on any suitable unit (e.g. block-by-block, plane-by-plane, or chip-wide). Initially, erase operations are performed using a first set of erase conditions 550. The first set of erase conditions may be used throughout an initial period of operation. The first set of erase conditions may include a target for bit line voltage and a separate target for select line voltage. The erase operations are tested to see if erase operations meet a certain standard 552. This check may be performed every time an erase operation is performed, or on some periodic basis, or randomly. As long as the erase operations continue to meet the standard then the first set of erase conditions continue to be used. Using such fixed target voltages provides simple, efficient erase operations. When erase operations fail to meet the standard then the first set of erase conditions are replaced with a second set of erase conditions 554. The second set of erase conditions may include a select line voltage that is offset by a target amount from a measured bit line voltage. In some cases, one or more tests are performed to ensure that the second set of erase conditions improve erase operations (e.g. dummy data may be programmed and erased one or more times). The second set of erase conditions may only be used if some improvement is observed. It will be understood that failing to meet the standard does not necessarily mean that erase failures occur. The quality of erase operations may be measured even when erase operations remain within the standard. Improved erase operation may be observed by comparing such quality measurement.

In some cases, one or more blocks in a plane may be marked as bad blocks because of erase failure when using the first set of erase conditions. Subsequently, when the first set of erase conditions are replaced, a memory system may test these blocks to determine if they still fail to erase when they are subject to an erase operation using the second set of erase conditions. If such a block is successfully erased using the second set of erase conditions then it may be removed from the bad block list and may be returned to use.

Figure 16:
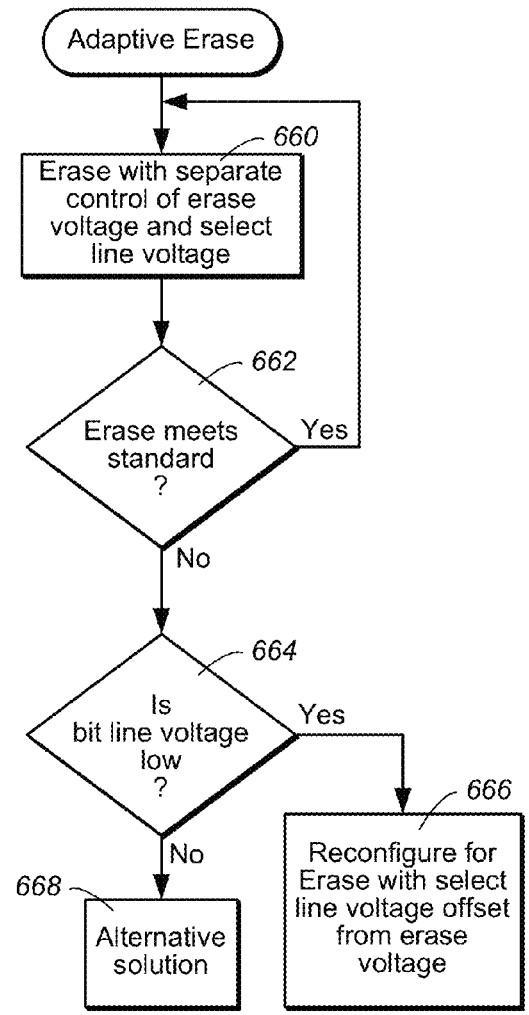
FIG. 16 illustrates another adaptive erase scheme.

FIG. 16 shows another example of an adaptive erase approach. Initially, an erase voltage applied to bit lines and source lines and a select line voltage are separately controlled 660. For example, separate drivers with fixed target voltages may be provided for erase voltage and select line voltage. As long as the erase operations meet a standard 662, this separate control is used for erase operations. If the standard is not met 662, a determination is made as to whether bit line voltage is low 664. This may be directly tested during erase if appropriate test circuits are provided. If the bit line voltage is low (i.e. more than a threshold amount below a target voltage) then reconfiguration occurs to perform subsequent erase operations with a select line voltage that is offset from the erase voltage 666. If the bit line voltage is not low then an alternative solution may be found (e.g. map out bad block or blocks) 668.

Figure 17:
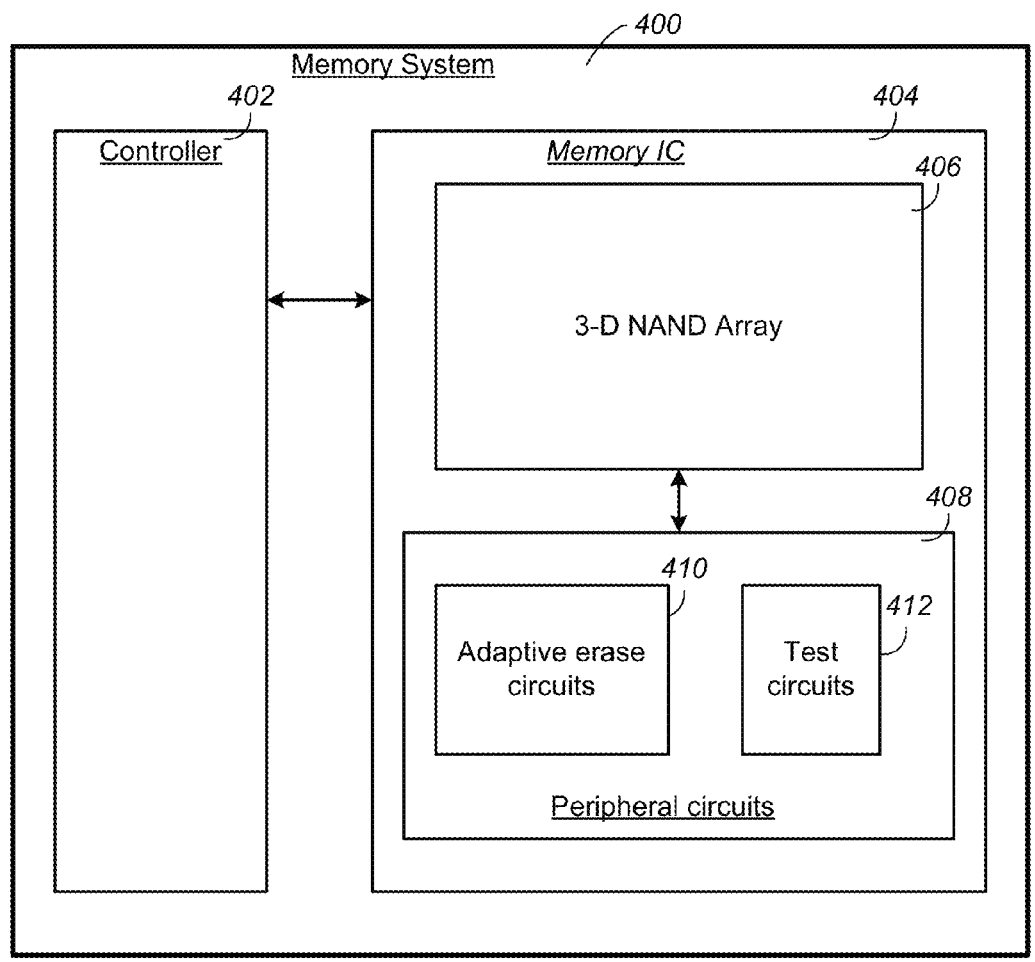
FIG. 17 shows an example of a memory system with adaptive erase.

FIG. 17 shows an example of hardware that may be used to implement aspects of the present invention. A memory system 400 includes a memory controller 402 and a memory IC (memory chip) 404. The memory IC 404 includes a 3-D NAND flash memory array 406 and peripheral circuits 408. In particular adaptive erase circuits 410 are provided which may include a bit line driver circuit and a select line driver circuit that may be operated with independent target voltages or may be operated together to maintain a fixed offset between bit line voltage and select line voltage. The adaptive erase circuits adapt to changing erase characteristics of the 3-D NAND array by changing from fixed target voltages to a fixed voltage difference at some point. Test circuits 412 are also provided to test the voltage on one or more bit lines and/or source lines so that a drop in bit line voltage from a target voltage can be detected.

While several of the above examples refer specifically to maintaining a fixed offset between measured bit line voltage and a select line voltage, it will be understood that source line voltage may be used instead of bit line voltage and that source select transistors and drain select transistors may be similarly controlled. Furthermore, it will be understood that reference to the "source" and "drain" of a NAND string and to "source select transistor" and "drain select transistor" does not limit voltages that may be applied, or how such transistors may be biased.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a three dimensional nonvolatile memory formed in two or more physical levels of memory cells disposed above a silicon substrate, comprising:
   operating a plane of the three dimensional nonvolatile memory according to a default erase scheme for erase operations during a first period of operation of the three dimensional nonvolatile memory array, the plane including a group of blocks connected by a common set of bit lines;
   subsequently determining that two or more blocks of the plane are not adequately erased using the default erase scheme;
   in response to the determining, measuring bit line voltage during an erase operation using the default erase scheme to identify a difference between measured bit line voltage and a target bit line voltage;
   in response to identifying that the difference exceeds a threshold amount, replacing the default set of erase parameters with a modified set of erase parameters for the plane, the modified set of erase parameters including at least one select voltage that is not fixed, the at least one select voltage being modulated according to a measured bit line voltage; and
   subsequently operating the plane of the three dimensional nonvolatile memory using the modified set of erase parameters throughout a second period of operation of the nonvolatile memory.

2. The method of claim 1 wherein the first period of operation extends from initialization of the three dimensional nonvolatile memory until a threshold number of blocks of the plane are identified as bad blocks that are not usable for storage of data because of erase failure.

3. The method of claim 2 further comprising testing the blocks identified as bad blocks because of erase failure to determine if they suffer from erase failure when erased using the modified set of erase conditions.

4. The method of claim 3 further comprising, for any block previously identified as a bad block because of erase failure and that does not suffer from erase failure when erased using the modified set of erase conditions, ceasing to identify the block as a bad block and returning the block to use when beginning the second period of operation of the nonvolatile memory array.

5. The method of claim 1 wherein the at least one select voltage is modulated according to the measured bit line voltage to provide a sufficient voltage difference between the select voltage and the measured bit line voltage to generate Gate Induced Drain Leakage (GIDL) in select transistors.

6. The method of claim 5 wherein the voltage difference is maintained at a fixed offset of at least 6 volts.

7. The method of claim 1 wherein the first set of erase conditions assigns an erase voltage of between 22 volts and 26 volts to the set of bit lines of the plane, and assigns a select voltage of between 15 volts and 19 volts to select lines of the plane, and wherein the second set of erase conditions assigns an erase voltage of between 22 volts and 26 volts to the set of bit lines of the plane, and modulates the at least one select voltage to be less than the measured bit line voltage by a fixed offset of between 6 volts and 10 volts.

8. The method of claim 1 wherein the second set of erase conditions includes at least another select voltage that is modulated according to a measured source line voltage to generate Gate Induced Drain Leakage (GIDL) in select transistors connected to the source line.

9. A three dimensional nonvolatile memory system comprising:
   a three dimensional nonvolatile memory formed in two or more physical levels of memory cells disposed above a substrate, the three dimensional memory including a plurality of planes, an individual plane including a plurality of memory blocks that share a set of bit lines; and
   an adaptive erase circuit on the substrate, the adaptive erase circuit configured to supply voltages to conductive lines of the plurality of memory blocks of a plane during an erase operation, the adaptive erase circuit having at least two operating modes, including: (i) a fixed mode in which a select voltage applied to a select line has a predetermined target, and (ii) an adaptive mode in which the select voltage applied to the select line is modulated according to a bit line voltage that is found by voltage measurement on the bit line.

10. The three dimensional nonvolatile memory system of claim 9 further comprising a testing circuit that tests a difference between a voltage on the bit line and a target bit line voltage in the fixed mode to determine if the difference exceeds a threshold.

11. The nonvolatile memory of claim 10 wherein the testing circuit is in communication with the adaptive erase circuit and in response to a determination by the testing circuit that the difference exceeds the threshold, the adaptive erase circuit changes from the fixed mode to the adaptive mode.

12. The three dimensional nonvolatile memory system of claim 11 further comprising a bad block list and wherein the testing circuit tests the difference in response to the number of bad blocks on the bad block list that are in the plane exceeding a limit.

13. The three dimensional nonvolatile memory system of claim 12 wherein, when the adaptive erase circuit changes from the fixed mode to the adaptive mode, bad blocks on the bad block list that are in the plane are subject to erase in the adaptive mode and are removed from the bad block list if they successfully erase in the adaptive mode.

14. The three dimensional nonvolatile memory system of claim 9 wherein the three dimensional nonvolatile memory includes a plurality of vertical memory holes and the adaptive erase circuit, in the adaptive mode, modulates the select voltage according to the bit line voltage to maintain a gate-drain voltage difference in a select transistor to provide sufficient Gate Induced Drain Leakage (GIDL) current to charge a vertical memory hole in the three dimensional nonvolatile memory for erase of memory cells.

15. The three dimensional nonvolatile memory system of claim 14 wherein the gate-drain voltage difference is maintained at about −7 volts.

16. A method of operating a three dimensional nonvolatile memory formed in two or more physical levels of memory cells disposed above a silicon substrate, comprising:

operating a plane of the three dimensional nonvolatile memory according to a default erase scheme for erase operations during a first period of operation of the three dimensional nonvolatile memory array, the plane including a group of blocks connected by a common set of bit lines;

subsequently determining that more than a threshold number of blocks of the plane are bad blocks because of failure to adequately erase using the default erase scheme;

in response to the determining, measuring bit line voltage during an erase operation using the default erase scheme to identify a difference between measured bit line voltage and a target bit line voltage;

in response to identifying that the difference exceeds a threshold amount, replacing the default set of erase parameters with a modified set of erase parameters for the plane, the modified set of erase parameters including at least one select voltage that is not fixed, the at least one select voltage being modulated according to a measured bit line voltage to provide a sufficient voltage difference between the select voltage and the measured bit line voltage to generate Gate Induced Drain Leakage (GIDL) in select transistors; and subsequently operating the plane of the three dimensional nonvolatile memory using the modified set of erase parameters throughout a second period of operation of the nonvolatile memory.

17. A three dimensional nonvolatile memory system comprising:

a three dimensional nonvolatile memory formed in two or more physical levels of memory cells disposed above a substrate, the three dimensional memory including a plurality of planes, an individual plane including a plurality of memory blocks that share a set of bit lines; and an adaptive erase circuit on the substrate, the adaptive erase circuit configured to supply voltages to conductive lines of the plurality of memory blocks of a plane during an erase operation, the adaptive erase circuit having at least two operating modes, including: (i) a fixed mode in which a select voltage applied to a select line has a predetermined target, the adaptive erase circuit configured to operate in the fixed mode until a number of blocks failing to adequately erase exceeds a threshold number and (ii) an adaptive mode in which the select voltage applied to the select line is modulated according to a bit line voltage that is found by voltage measurement on the bit line, the modulation providing a sufficient voltage difference between the select voltage and the bit line voltage to provide Gate Induced Drain Leakage (GIDL) current.

* * * * *